United States Patent
Phan et al.

(10) Patent No.: US 9,360,514 B2
(45) Date of Patent: Jun. 7, 2016

(54) THERMAL RELIABILITY TESTING SYSTEMS WITH THERMAL CYCLING AND MULTIDIMENSIONAL HEAT TRANSFER

(71) Applicants: Huy N. Phan, Fort Worth, TX (US); Dereje Agonafer, Southlake, TX (US)

(72) Inventors: Huy N. Phan, Fort Worth, TX (US); Dereje Agonafer, Southlake, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 545 days.

(21) Appl. No.: 13/828,870

(22) Filed: Mar. 14, 2013

(65) Prior Publication Data

US 2014/0103947 A1 Apr. 17, 2014

Related U.S. Application Data

(60) Provisional application No. 61/620,759, filed on Apr. 5, 2012.

(51) Int. Cl.
*G01R 31/10* (2006.01)
*G01R 31/00* (2006.01)
*G01R 31/28* (2006.01)

(52) U.S. Cl.
CPC .......... *G01R 31/003* (2013.01); *G01R 31/2874* (2013.01); *G01R 31/2862* (2013.01)

(58) Field of Classification Search
CPC ............. G01R 31/003; G01R 31/2874; G01R 31/2862
USPC ................................ 324/105, 750.03–750.09, 324/762.01–762.02, 750.14; 361/695, 697, 361/702, 709, 710; 62/3.1–3.3, 3.7; 219/520–521; 165/61
See application file for complete search history.

(56) References Cited

U.S. PATENT DOCUMENTS

| 4,689,659 A | * | 8/1987 | Watanabe | ........... H01L 27/0211 257/469 |
| 4,868,712 A | * | 9/1989 | Woodman | ........... H01L 23/5385 257/E23.172 |
| 5,016,138 A | * | 5/1991 | Woodman | ........... H01L 23/5385 174/252 |
| 5,032,897 A | * | 7/1991 | Mansuria | ................ H01L 23/38 257/701 |
| 5,545,473 A | * | 8/1996 | Ameen | ............... H01L 23/3737 257/E23.107 |

(Continued)

OTHER PUBLICATIONS

Huy Phan, Development of an experimental and analytical model of an active cooling method for high-power three-dimensional integrated circuit (3D-IC) utilizing multidimensional configured thermoelectric modules, The University of Texas at Arlington. May 2011.*

*Primary Examiner* — Jermele M Hollington
*Assistant Examiner* — Sean Curtis
(74) *Attorney, Agent, or Firm* — FisherBroyles, LLP; Anthony J. DoVale (57) ABSTRACT

Devices, methods, and systems for facilitating heat transfer around an electronic component during thermal-cycle testing are presented. A system may include a core, a plurality of solid state heating/cooling devices, and a plurality of heat sinks. The core defines one or more cavities for receiving an electronic component. The system may include an air mover and a duct. In operation, the system may cool an electronic component to sub-ambient temperatures and heat it to above the boiling point of water. A method of thermal-cycle testing may include a core defining a cavity for receiving an electronic component, selectively inducing said heating/cooling devices to operate in a heating mode or a cooling mode, and measuring and recording conditions during the test.

16 Claims, 9 Drawing Sheets

(56) References Cited

U.S. PATENT DOCUMENTS

| | | | | |
|---|---|---|---|---|
| 5,569,950 A * | 10/1996 | Lewis | H01L 23/34 | 257/467 |
| 5,704,419 A * | 1/1998 | Agonafer | F28F 3/12 | 165/121 |
| 5,974,902 A * | 11/1999 | Scofield | G01N 25/145 | 73/865.6 |
| 6,370,884 B1 * | 4/2002 | Kelada | B67D 1/0869 | 62/3.3 |
| 6,418,019 B1 * | 7/2002 | Snyder | H01L 23/427 | 165/104.23 |
| 6,705,089 B2 * | 3/2004 | Chu | F25B 21/02 | 136/204 |
| 6,728,653 B1 * | 4/2004 | Figueredo | G01R 31/2853 | 324/703 |
| 6,750,646 B1 * | 6/2004 | Voss | G01R 31/2817 | 324/750.03 |
| 6,798,659 B2 * | 9/2004 | Chen | H01L 23/38 | 165/121 |
| 7,059,137 B2 * | 6/2006 | Childress | B60H 1/00264 | 62/259.2 |
| 7,285,968 B2 * | 10/2007 | Eldridge | G01R 31/2863 | 324/750.03 |
| 7,338,818 B2 * | 3/2008 | Arroyo | G01K 7/425 | 257/E23.08 |
| 7,436,059 B1 * | 10/2008 | Ouyang | H01L 23/34 | 257/712 |
| 7,513,686 B2 * | 4/2009 | Schaffer | G01K 7/08 | 374/179 |
| 7,554,349 B2 * | 6/2009 | Kang | G01R 31/2865 | 324/750.03 |
| 7,554,808 B2 * | 6/2009 | Scott | F25B 21/02 | 165/80.2 |
| 7,604,040 B2 * | 10/2009 | Ghosh | H01L 23/473 | 165/104.33 |
| 7,734,444 B2 * | 6/2010 | Arroyo | G01K 7/425 | 324/750.03 |
| 7,814,928 B2 * | 10/2010 | Maltezos | G05D 23/19 | 137/340 |
| 7,933,119 B2 * | 4/2011 | Wiltzius | G06F 1/20 | 165/104.33 |
| 7,954,332 B2 * | 6/2011 | Orlowski | H05K 7/20945 | 165/104.33 |
| 8,274,300 B2 * | 9/2012 | Sakaue | G01R 31/2875 | 165/247 |
| 8,358,503 B2 * | 1/2013 | Carter | G06F 1/181 | 361/690 |
| 8,653,843 B2 * | 2/2014 | Ando | G01R 31/2874 | 324/750.04 |
| 8,749,254 B2 * | 6/2014 | Su | G01R 31/2817 | 324/750.03 |
| 8,766,656 B2 * | 7/2014 | Malik | G01R 31/2875 | 324/750.05 |
| 8,896,335 B2 * | 11/2014 | Stuckey | H01L 23/4735 | 165/101 |
| 8,962,306 B2 * | 2/2015 | Cohen | B01L 7/52 | 435/287.2 |
| 2002/0131237 A1 * | 9/2002 | Snyder | F28D 15/0233 | 361/719 |
| 2003/0067069 A1 * | 4/2003 | Lebonheur | H01L 23/433 | 257/706 |
| 2004/0025516 A1 * | 2/2004 | Van Winkle | B60H 1/00478 | 62/3.3 |
| 2004/0108104 A1 * | 6/2004 | Luo | F28F 13/00 | 165/181 |
| 2005/0011199 A1 * | 1/2005 | Grisham | F25B 21/02 | 62/3.7 |
| 2005/0121776 A1 * | 6/2005 | Deppisch | H01L 23/42 | 257/712 |
| 2005/0252228 A1 * | 11/2005 | Su | F25B 21/02 | 62/259.2 |
| 2006/0048519 A1 * | 3/2006 | Childress | B60H 1/00264 | 62/3.3 |
| 2007/0204627 A1 * | 9/2007 | Pan | F25B 21/02 | 62/3.2 |
| 2007/0204628 A1 * | 9/2007 | Pan | F25B 21/02 | 62/3.2 |
| 2007/0291234 A1 * | 12/2007 | Momose | F25B 21/02 | 353/52 |
| 2007/0297139 A1 * | 12/2007 | Scott | F25B 21/02 | 361/700 |
| 2009/0203082 A1 * | 8/2009 | Schlaubitz | B01L 7/52 | 435/91.2 |
| 2010/0200197 A1 * | 8/2010 | Bezama | H01L 23/3733 | 165/84 |
| 2010/0203595 A1 * | 8/2010 | Ward | B01L 7/52 | 435/91.2 |
| 2011/0165628 A1 * | 7/2011 | Verhaar | B01L 3/50851 | 435/91.2 |
| 2012/0211204 A1 * | 8/2012 | Agonafer | H01L 23/473 | 165/104.31 |
| 2013/0113509 A1 * | 5/2013 | Wu | G01R 31/2874 | 324/750.03 |

* cited by examiner

THERMAL RELIABILITY TESTING SYSTEMS WITH THERMAL CYCLING AND MULTIDIMENSIONAL HEAT TRANSFER

CROSS-REFERENCE TO RELATED APPLICATIONS

This application claims the benefit of and priority to U.S. Provisional Application No. 61/620,759, entitled "Apparatus And Method For Multidimensional Thermal Cycling," filed Apr. 5, 2012, which is herein incorporated by reference in its entirety.

BACKGROUND

The following disclosure relates generally to systems for testing the thermal, mechanical, and environmental reliability of electronic components. Electronic components such as microchips and microprocessors generate large amounts of heat relative to their size during normal operation. Newly designed chip packages need to be tested using a fast and robust system that includes thermal cycling (i.e., both heating and cooling) in order to approximately model a real-world operating environment.

Existing systems for reliability testing typically require a large thermal chamber that is time-consuming and costly to run, especially when there is a need to test only a few chips. Moreover, existing thermal cycling chambers are not designed to accommodate three-dimensional integrated circuits in which several microchips are placed together in a three-dimensional stack configuration (stack-chip). Stacked chips further concentrate the generation of heat energy within the chip, creating the need for a testing system that is capable of fully penetrating 3D chip architectures with heating, cooling, and moisture testing.

SUMMARY

A system for testing electronic components, according to various embodiments, includes a core in thermal communication with the electronic component, a plurality of solid state heating/cooling devices each in thermal communication with the core, plurality of heat sinks each in thermal communication with one of the plurality of solid state heating/cooling devices, and an air flow bench with a test chamber, wherein the core and the electronic component are positioned inside the test chamber. A cavity defined by the core may be sized shaped to receive the electronic component.

A method of thermal-cycle testing an electronic component, according to various embodiments, includes the steps of providing a core that defines a cavity sized and shaped to receive an electronic component; placing an electronic component into the cavity, such that the electronic component is in thermal communication with the core; at least partially surrounding the core with one or more solid state heating/cooling devices, each in thermal communication with the core and connected to a power supply; at least partially surrounding the one or more solid state heating/cooling devices with a plurality of heat sinks, each in thermal communication with one of the plurality of solid state heating/cooling devices; selectively supplying power to the electronic component to confirm its status; heating the electronic component in an unpowered state to a predetermined maximum temperature by selectively placing the one or more solid state heating/cooling devices into a heating mode; cooling the electronic component to a predetermined minimum temperature by selectively placing the one or more solid state heating/cooling devices into a cooling mode; and selectively supplying power to the electronic component to confirm its status. In another aspect, the steps of heating and cooling may further include providing a control circuit that is configured to induce the heating mode, and selectively reverse the current in order to induce the cooling mode.

Other systems, methods, apparatuses, features, and advantages of the disclosed embodiments will be apparent to one of ordinary skill in the art upon examination of the following figures and detailed description. All such additional apparatuses, methods, systems, features, and advantages are intended to be included within this description and to be included within the scope of the accompanying claims.

BRIEF DESCRIPTION OF THE DRAWING

Having thus described various embodiments in general terms, reference will now be made to the accompanying drawings, which are not necessarily drawn to scale, and wherein:

DETAILED DESCRIPTION

The present systems and apparatuses and methods are understood more readily by reference to the following detailed description, examples, drawing, and claims, and their previous and following descriptions. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

The following description is provided as an enabling teaching in its best, currently known embodiment. To this end, those skilled in the relevant art will recognize and appreciate that many changes can be made to the various aspects described herein, while still obtaining the beneficial results of the technology disclosed. It will also be apparent that some of the desired benefits can be obtained by selecting some of the features while not utilizing others. Accordingly, those with ordinary skill in the art will recognize that many modifications and adaptations are possible, and may even be desirable in certain circumstances, and are a part of the invention described. Thus, the following description is provided as illustrative of the principles of the invention and not in limitation thereof.

As used throughout, the singular forms "a," "an" and "the" include plural referents unless the context clearly dictates otherwise. Thus, for example, reference to "a" component can include two or more such components unless the context indicates otherwise. Also, the words "proximal" and "distal" are used to describe items or portions of items that are situated closer to and away from, respectively, a user or operator. Thus, for example, the tip or free end of a device may be referred to as the distal end, whereas the generally opposing end or handle may be referred to as the proximal end.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Thermal Reliability Testing Systems

Figure 7:
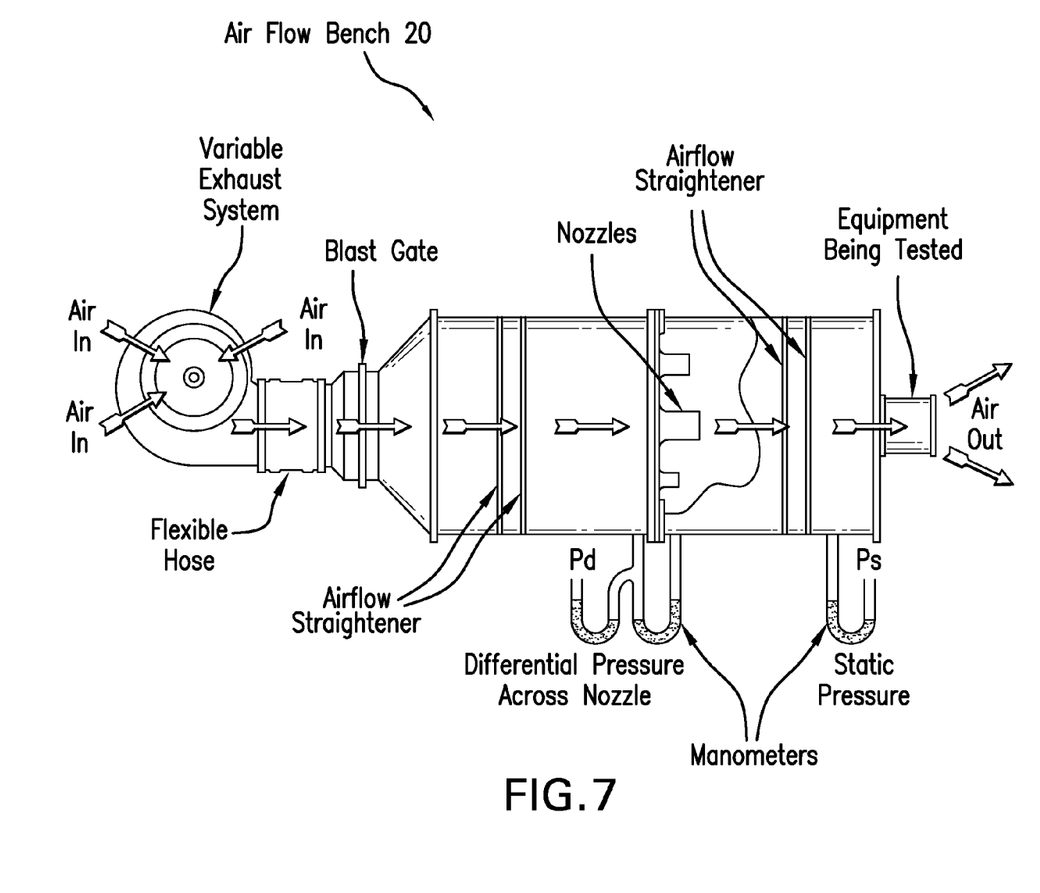
FIG. 7 is a schematic illustration of an air flow bench.

The following disclosure relates generally to systems for testing the thermal and environmental reliability of electronic components, and to a multi-dimensional heat transfer system for use with such systems. According to various embodiments, a thermal testing system includes an air flow bench 20, as illustrated in FIG. 7, along with controls and sensors, and an electronic component to be tested. The air flow bench and its interior chamber, for example, may meet or exceed the standards set forth in the American National Standard, *Laboratory Methods of Testing Fans for Aerodynamic Performance Rating*, ANSI/AMCA 210-99/ASHRAE 51-1999.

Referring to the air flow bench 20 in FIG. 7, the electronic component to be tested, in various embodiments described herein, may be placed in a heat transfer system, which may be placed inside an insulated thermal chamber and positioned in the area labeled "Equipment Being Tested" in FIG. 7. The electronic component, in particular embodiments, may be cycled between a low temperature of −40° C. (−40° F.) and a high temperature of 120° C. (248° F.). The electronic component may be cooled back to ambient or room temperature, 22.7° C. (72.9° F.), between each thermal cycling test. A thermal cycling testing system and protocol was described by the inventors, Phan and Agonafer, in an article entitled, "Cost Effective Multidimensional-Thermal-Cycling-System (MTCS) Utilizing Thermoelectric Coolers for Rapid Assessment of 3D-IC Reliability," which is incorporated herein by reference in its entirety.

Figure 8:
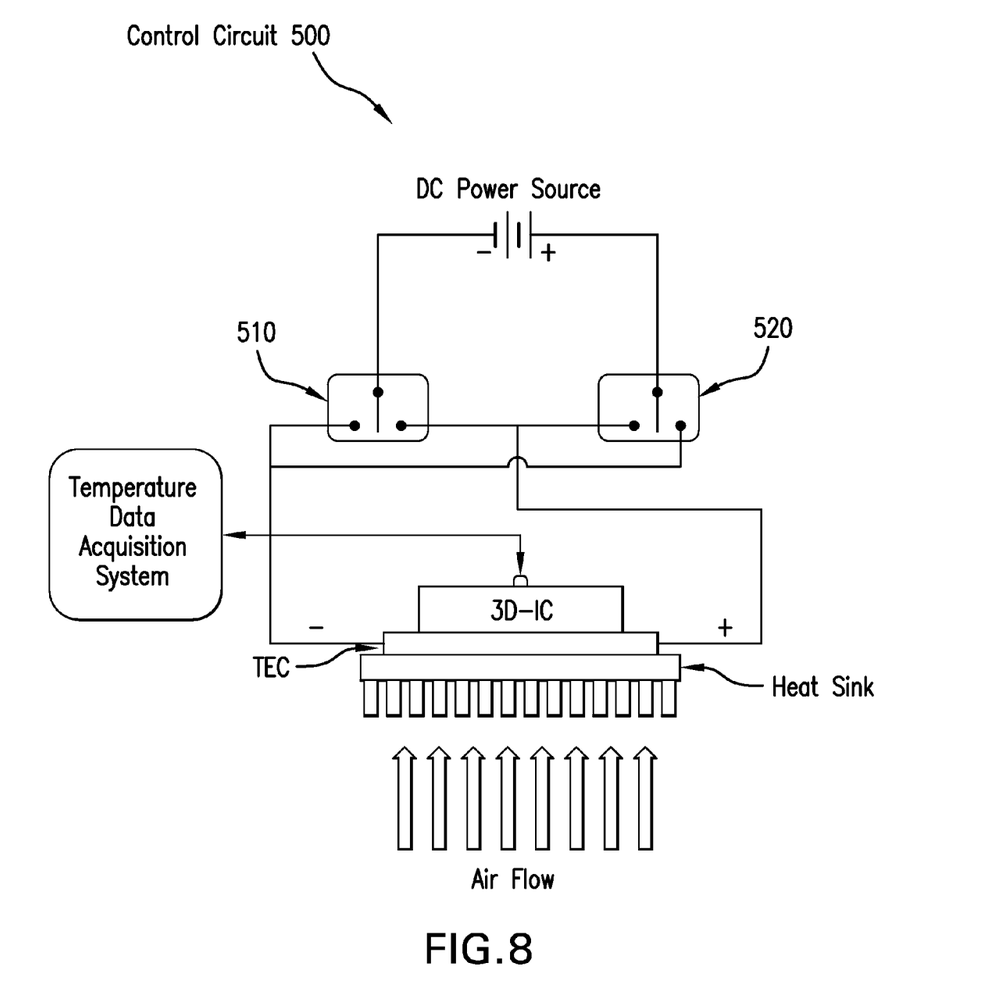
FIG. 8 is a schematic illustration of a control circuit, according to various embodiments.

As described herein, the thermal testing system sensors may include one or more thermocouples for sensing the temperatures of various components. The thermal testing system may also include a DC power supply for the solid state cooling/heating devices and a control circuit 500, shown schematically in FIG. 8. In the heating mode, both three-way switches 510, 520 were switched to the positive power (+) source, connected to the negative lead (−) of the thermoelectric module (TEC). In the cooling mode, both switches 510, 520 were reversed, which put the positive (+) power source connected to the positive (+) lead of the thermoelectric module (TEC). This control circuit 500 minimized the time delay that may occur from manually switching the polarities of the thermoelectric modules. The control circuit 500 may be accomplished mechanically or by using a computer-based I/O circuit.

Heat Transfer System

A heat transfer system, according to various embodiments, includes a core, a plurality of solid state cooling/heating devices (such as thermoelectric modules, for example, which are capable of operating in a cooling mode or a heating mode), and a plurality of heat sinks. These components cooperate in order to cool, and to heat, an electronic component by enhancing the heat transfer. In various embodiments, the heat transfer system described herein can cool an electronic component to sub-ambient temperatures (i.e., below the temperature of the surrounding environment) and also heat the electronic component to a high temperature (above the boiling point of water, for example).

The electronic component in various embodiments may include a plurality of components, such as one or more microchips, microprocessors, log boards, memory boards, stand-alone integrated circuits, and combinations or derivatives thereof. The electronic component may also include a three-dimensional integrated circuit (3D-IC) in which several microchips are placed together in a 3D configuration.

The core, the solid state cooling/heating devices, and the heat sinks may be in thermal communication with one another. Thermal communication between parts may be accomplished by using a thermal compound, a thermal pad, a thermal adhesive, or other substance that acts as a thermal interface. For embodiments where the solid state cooling/heating device is a thermoelectric module, for example, a thin skim of thermal compound may be used between the contact side of the thermoelectric module and the outer wall of the core.

The core may include a base, a generally opposing top surface, and at least one side surface. In various embodiments, the base of the core defines a cavity that is sized and shaped to receive the electronic component. The cavity may be sized and shaped to a close tolerance relative to the size and shape of the electronic component. In this aspect, the electronic component may be in direct physical contact with the cavity walls. In various embodiments, the cavity may be sized and shaped to receive the electronic component surrounded by a liquid bath.

In various embodiments, any external surfaces of the core that are not in contact with a thermoelectric module, a heat sink, or another device may be thermally insulated. For example, in one embodiment, all exposed corners and surfaces may be sealed with injection, closed-cell foam, and a nano-silver particle thermal interface material.

The core may be any combination of sizes, shapes, and materials that is best suited for a particular system. For example, the core may be a cube made of oxygen-free copper, an excellent conductor of heat. The core may also be made of other heat-conducting materials, such as carbon, carbon graphite, or aluminum. The core may have an amorphous shape or a regular shape, such as a cube, polyhedron, prism or pyramid. The core may be made of a single material or several different materials. The core may be solid or liquid, or a combination of the two.

The components referred to herein as thermoelectric modules may include any type of solid state cooling/heating device such as a Peltier device, Peltier heat pump, a solid state refrigerator, thermoelectric cooler (TEC), or thermal diode. The term "thermoelectric module" is used for convenience, and not as a limitation, because it is a common type of solid state device that can be used for cooling and/or heating. The thermoelectric modules may be substantially planar in shape or curved. They may be disposed on a flexible substrate. In one aspect, the thermoelectric modules may be selected to conform to the outer surface of the core. For example, a cube-shaped core has up to five outer surfaces where any number of thermoelectric modules can be placed.

The heat sinks may be passive or active. In the first embodiment, the heat sinks include a base plate and a plurality of fins. In a passive heat sink, heat is removed from the fins by natural convection and radiation. In an active heat sink, one or more portions of the heat sink, such as the base plate, may contain a fluid or vapor, in order to enhance more uniform heat transfer to the fins. The heat sinks may have base plates that are substantially planar in shape or curved. The heat sinks may be rigid or flexible. In one aspect, the heat sinks may be selected to conform to the outer surface or "hot side" of the thermoelectric modules. In this aspect, the heat sinks may cooperate with the thermoelectric modules in order to increase the heat transfer accomplished by the heat transfer system.

The heat transfer system may also include an air mover for producing a flow of air, or gas, or another fluid. The flow created by the air mover helps increase the effectiveness of the heat sinks. The air mover may be a fan, or any type of device capable of producing a desired flow. For example, one or more of the heat sinks may be a fanned heat sink, in which the air mover is an integral part of the heat sink. The space available, the geometry of nearby components, and the optimization of the desired heat transfer rate are some of the constraints that may influence the selection of an air mover best suited for a particular system. The heat transfer system may also include one or more ducts positioned to direct at least a portion of the flow of air toward a desired location. The duct may have substantially solid walls or may include a number of holes or perforations in order to facilitate a desired air flow pattern.

The heat transfer systems described herein may operate in a dry environment, where air or another gas surrounds the electronic components and the heat transfer system. The heat transfer systems described herein may also operate in a liquid environment, where a non-conductive fluid, for example, surrounds the electronic components and the heat transfer system.

First Embodiment

Figure 1:
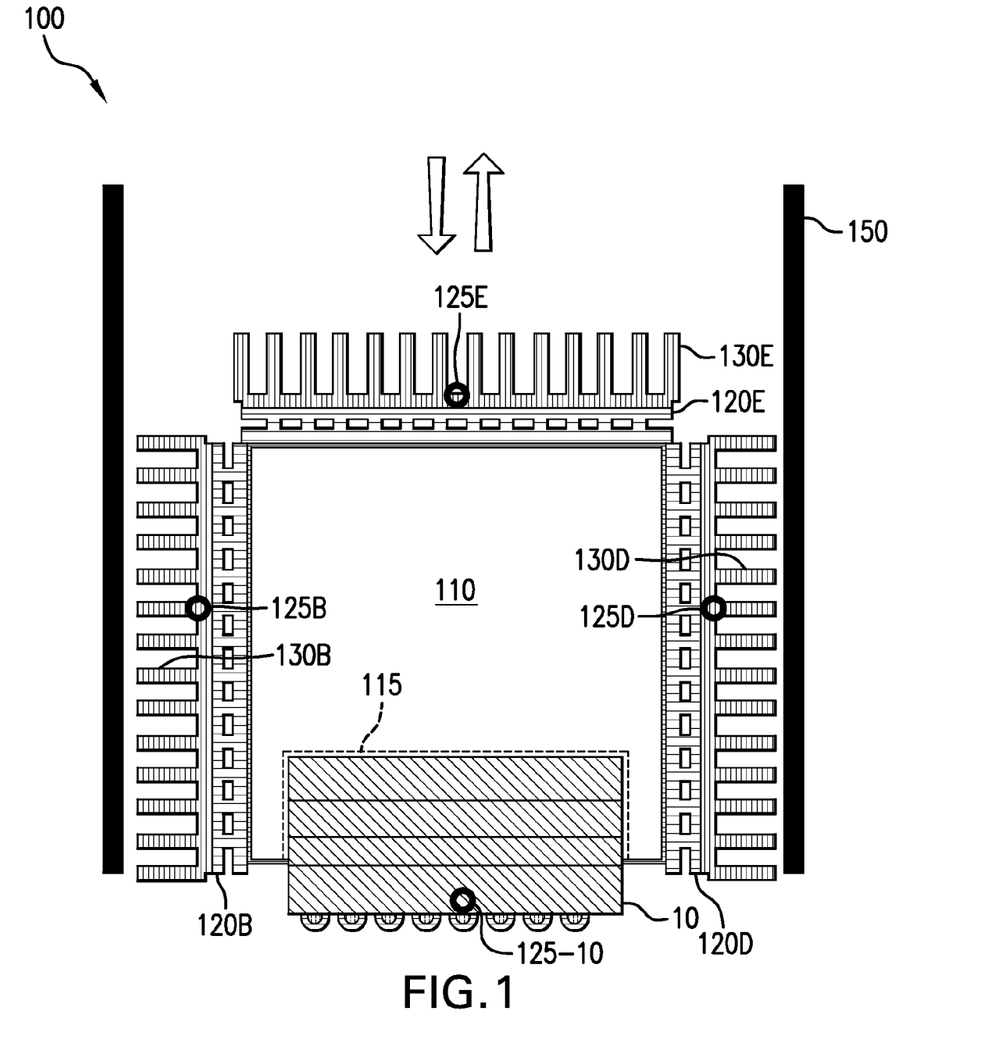
FIG. 1 is a cross-sectional illustration of a heat transfer system according to a first embodiment.

FIG. 1 is a cross-sectional illustration of an exemplary heat transfer system 100 according to a first embodiment. As shown, the heat transfer system 100 includes a core 110, a plurality of thermoelectric modules 120B, 120D, 120E, and a plurality of heat sinks 130B, 130D, 130E. The system also includes a plurality of thermocouples 125B, 125D, 125E, and 125-10 for sensing temperatures. The thermocouples may be connected to a temperature data acquisition system (shown schematically in FIG. 8).

The system 100 may be positioned atop an electronic component 10, such as the stacked three-dimensional chip (3D-IC) shown. The core 110 defines a cavity 15 that is sized and shaped to receive the electronic component 10.

The heat transfer system 100 may also include an air mover (not shown) for producing a flow of air. As shown, the heat transfer system 100 may also include a duct 150 positioned to direct at least a portion of the flow of air toward a desired location.

Figure 9:
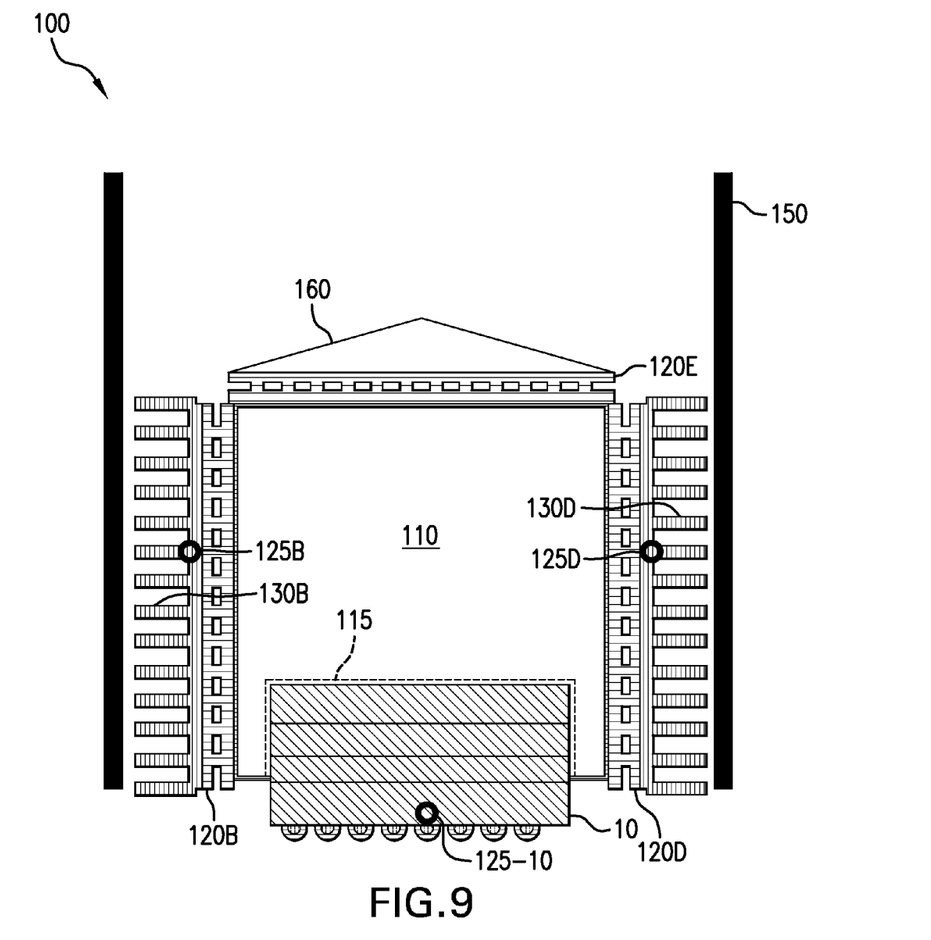
FIG. 9 is a cross-sectional illustration of the heat transfer system of FIG. 1, according to various embodiments.

In an alternative embodiment, illustrated in FIG. 9, the heat transfer system 100 may include insulation 160 instead of a heat sink on the top surface of the core 110. In this alternative embodiment, all exposed corners and surfaces may be sealed with injection, closed-cell foam, and a nano-silver particle thermal interface material to enhance the heat transfer between the thermoelectric modules and the central core 110.

Figure 2:
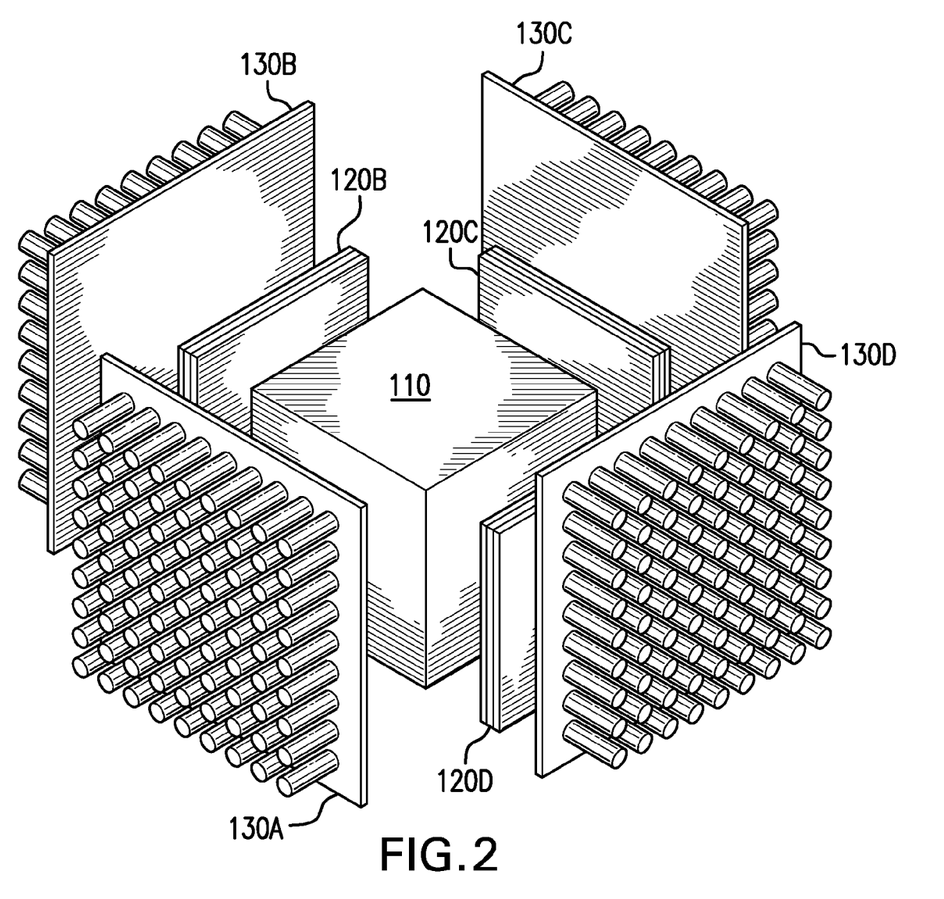
FIG. 2 is a perspective, exploded view of the heat transfer system of FIG. 1, from the side.

FIG. 2 is a perspective, exploded view of the heat transfer system 100 illustrated in FIG. 1. As shown, the heat transfer system 100 includes a core 110, four thermoelectric modules 120A (present but not seen), 120B, 120C, and 120D, and a corresponding set of four heat sinks 130A, 130B, 130C, and 130D. The system may also include a plurality of thermocouples 125 (not shown) for sensing temperatures. As shown, the upper external surface of the core 110 may be thermally insulated, as illustrated in FIG. 9 because that surface is not in contact with a thermoelectric module, a heat sink, or any other device. In this aspect, any external surfaces of the core 110 that are not in contact with a thermoelectric module, a heat sink, or another device may be thermally insulated.

Figure 3:
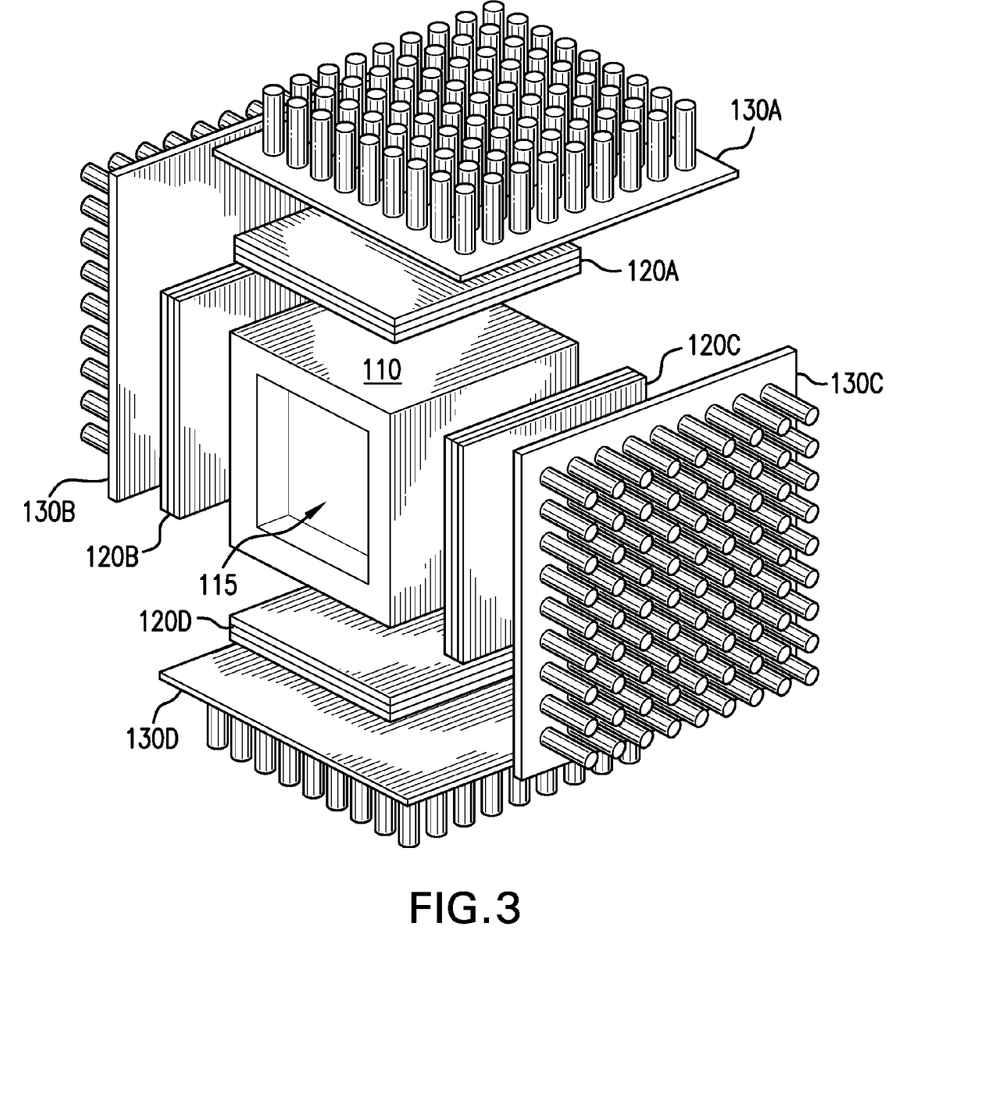
FIG. 3 is a perspective, exploded view of the heat transfer system of FIG. 1, from the bottom.

FIG. 3 is a perspective, exploded view of the heat transfer system 100 illustrated in FIG. 1, showing the bottom or base of the core 110. As shown, the base of the core 110 defines a cavity 115 for receiving the electronic component 10 (not shown) to be cooled. The cavity 115 may be sized and shaped to a close tolerance relative to the size and shape of the electronic component 10. In this aspect, the electronic component 10 may be in direct physical contact with the walls of the cavity 115. In alternate embodiments, the cavity 115 may be positioned to hold a liquid bath, and sized and shaped to receive the electronic component 10 surrounded by a fluid.

When the heat transfer system 100 of the first embodiment is in operation, the core 110 is positioned adjacent the electronic component 10 to be cooled—either in physical contact, or in thermal conduct via a liquid bath—so that the core 110 is in thermal communication with the electronic component 10. The core 110 in this aspect acts like a single monolithic fin of a heat exchanger, transferring heat upward and outward, away from the component 10.

The plurality of thermoelectric modules 120 at least partially surround and are in thermal communication with the core 110. The thermoelectric modules 120 may be controlled to either heat the core 110 or cool (i.e., dissipate the heat away from) the core 110. In cooperation with the thermoelectric modules 120, the plurality of heat sinks 130 are positioned in thermal communication with one or more of the thermoelectric modules 120 in order to further increase heat transfer. The optional air mover 140 facilitates additional heat transfer by creating a flow of air across the heat sinks 130. The optional duct 150 directs the flow of air toward any desired location in and around the various components of the system 100.

Second Embodiment

Figure 4:
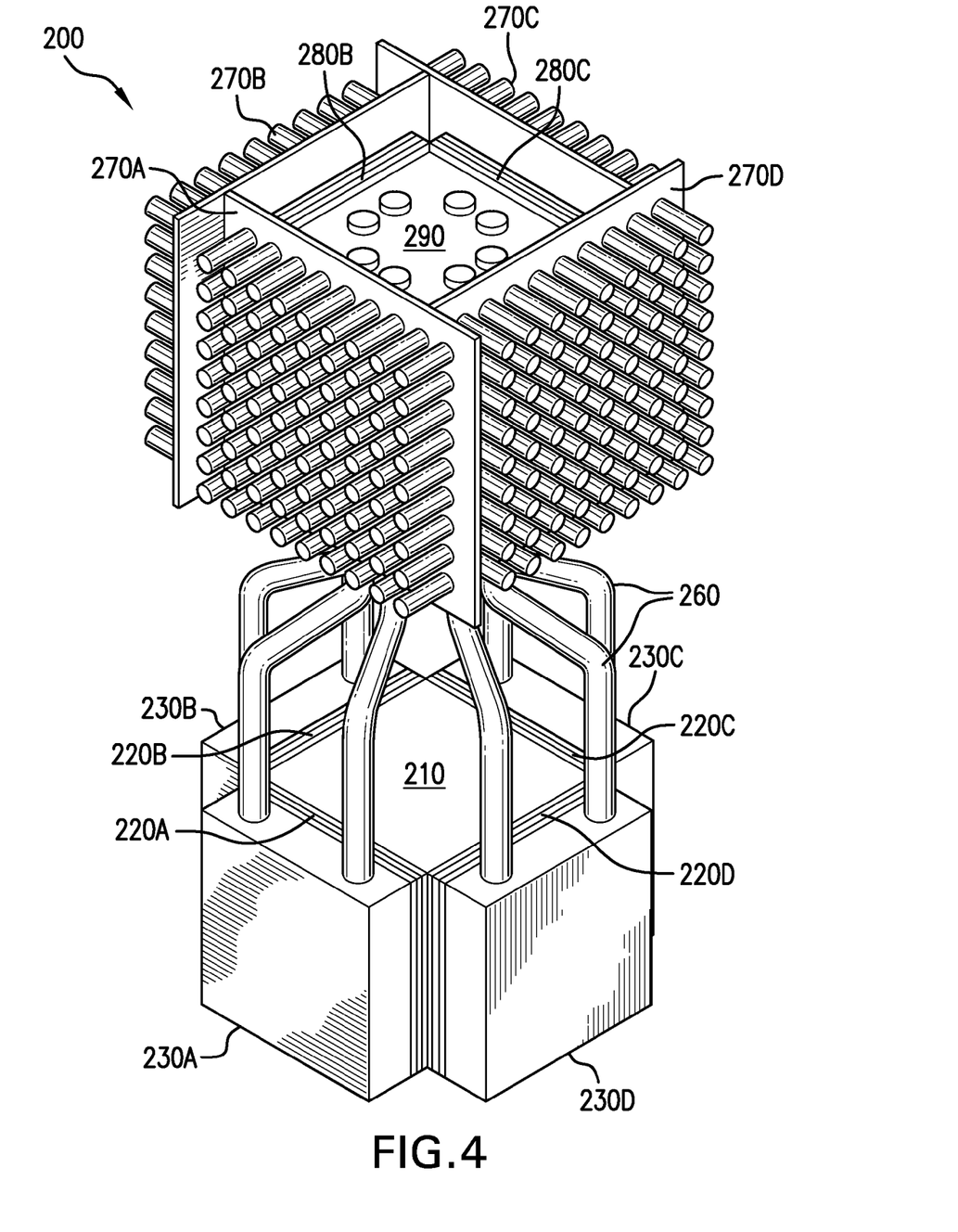
FIG. 4 is a perspective illustration of a heat transfer system according to a second embodiment.

FIG. 4 is a perspective illustration of a heat transfer system 200 according to a second embodiment. As shown, the heat transfer system 200 may include a primary core 210 and a secondary core 290. The primary core 210 and secondary core 290 may be arranged in a substantially vertical stack, as shown; or in a substantially horizontal stack. In operation, the system 200 may cool the electronic component 10 to sub-ambient temperatures.

The heat transfer system 200 may include a plurality of primary thermoelectric modules 220A, 220B, 220C, 220D in thermal communication with the primary core 210. The system 200 may also include a plurality of primary heat sinks 230A, 230B, 230C, 230D in thermal communication with the thermoelectric modules. The system 200 may also include a plurality of primary thermocouples 225 (not shown) for sensing temperatures.

Similarly, the secondary core 290 may include a plurality of secondary thermoelectric modules 280A (not seen), 280B, 280C, 280D (not seen) and a plurality of secondary heat sinks 270A, 270B, 270C, 270D. The system 200 may also include a plurality of secondary thermocouples 285 (not shown). The system 200 may also include an air mover (not shown) and/or a duct (not shown).

Any external surfaces of the primary core 210 and secondary core 290 that are not in contact with a thermoelectric module, a heat sink, or another device may be thermally insulated (not shown). As illustrated in FIG. 9 for the first embodiment, selected external surfaces of the cores 210, 290 may be insulated. For example, all exposed corners and surfaces may be sealed with injection, closed-cell foam, and a nano-silver particle thermal interface material to enhance the heat transfer between the thermoelectric modules and cores 210, 290.

Instead of having fins and using primarily air to facilitate heat transfer, the primary heat sinks 230A, 230B, 230C, 230D in this second embodiment include embedded pipes through which a cooling fluid is circulated. As shown in FIG. 4, the heat transfer system 200 of the second embodiment may include one or more pipes or liquid conduits 260 for facilitating the flow of a cooling fluid between one or more of the primary heat sinks 230A, 230B, 230C, 230D and the secondary core 290. In this aspect, the cooling fluid increases the cooling efficiency of the primary heat sinks. The liquid conduits 260 may define a substantially closed circuit for the cooling fluid. The cooling fluid may flow in response to convection, radiation, capillary action, wicking, siphon action, or other natural force. Alternatively, the cooling fluid may be circulated by a mechanical force such as a pump (not shown). The liquid conduits may be generally cylindrical, as illustrated, or they may be partially flattened in cross-section, for example, in order to conserve space and/or otherwise promote the natural circulation of the cooling fluid. The liquid conduits may also include embedded fins on the interior, for example, to further facilitate heat transfer.

When the heat transfer system 200 of the second embodiment is in operation, the primary core 210 is positioned adjacent the electronic component 10 to be cooled. Heat dissipates through the primary core 210, through the primary thermoelectric modules 220A, 220B, 220C, 220D, and through the primary heat sinks 230A, 230B, 230C, 230D. The liquid conduits 260 carry a cooling fluid that further dissipates the heat by circulating the fluid away and into the secondary core 290. Here, the heat is further dissipated through the secondary core 290 itself, through the secondary thermoelectric modules 280A (not seen), 280B, 280C, 280D (not seen), and then through the secondary heat sinks 270A, 270B, 270C, 270D.

Third Embodiment

Figure 5:
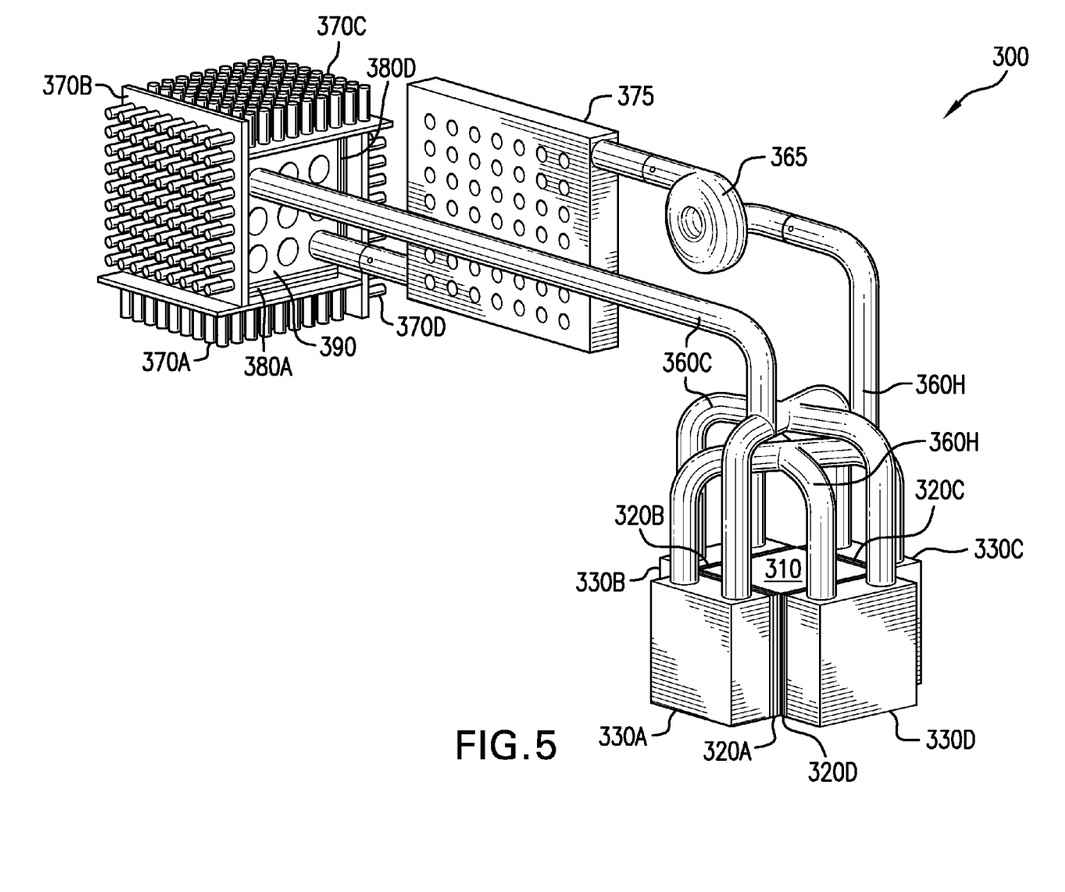
FIG. 5 is a perspective illustration of a heat transfer system according to a third embodiment.

FIG. 5 is a perspective illustration of a heat transfer system 300 according to a third embodiment. As shown, the heat transfer system 300 may include a local core 310 and a remote core 390. The local core 310 and remote core 390 may be arranged in a substantially vertical stack, or the remote core 390 may be somewhat offset, as shown in FIG. 5. In operation, the system 300 may cool the electronic component 10 to sub-ambient temperatures.

The heat transfer system 300 of the third embodiment may include a plurality of local thermoelectric modules 320A, 320B, 320C, 320D in thermal communication with the local core 310. The system 300 may also include a plurality of local heat sinks 330A, 330B, 330C, 330D in thermal communication with the thermoelectric modules. The system 300 may also include a plurality of local thermocouples 325 (not shown) for sensing temperatures in an around the local core 310.

The remote core 390 may include a plurality of remote thermoelectric modules 380A, 380B (not seen), 380C (not seen), 380D and a plurality of remote heat sinks 370A, 370B, 370C, 370D. The system 300 may also include a plurality of remote thermocouples 385 (not shown) for sensing temperatures in an around the remote core 390. The system 300 may also include an air mover (not shown) and/or a duct (not shown) positioned adjacent the remote heat sinks. Any external surfaces of the local core 310 and the remote core 390 that are not in contact with a thermoelectric module, a heat sink, or another device may be thermally insulated (not shown).

Instead of having fins and using primarily air to facilitate heat transfer, the local heat sinks 330A, 330B, 330C, 330D in this third embodiment include embedded pipes through which a cooling fluid is circulated.

As shown in FIG. 5, the heat transfer system 300 of the third embodiment may include one or more pipes or liquid conduits 360H, 360C for facilitating the flow of a cooling fluid between one or more of the local heat sinks 330A, 330B, 330C, 330D and the remote core 390. In this aspect, the cooling fluid increases the cooling efficiency of the local heat sinks.

The liquid conduits 360H, 360C may define a substantially closed circuit for the cooling fluid. The cooling fluid may flow in response to convection, radiation, capillary action, wicking, or other natural force. Alternatively, the cooling fluid may be circulated by a mechanical force such as a pump 365. The liquid conduits may be generally cylindrical, as illustrated, or they may be partially flattened in cross-section, in order to conserve space and/or otherwise promote the natural circulation of the cooling fluid.

The heat transfer system 300 of the third embodiment may also include a radiator 375, as shown in FIG. 5, positioned between one or more of the local heat sinks and the remote core 390. In one aspect, the radiator 375 acts like another remote heat sink because it is positioned away from the primary core 310. The system 300 may also include an air mover (not shown) and/or a duct (not shown) positioned adjacent the radiator 375 in order to facilitate heat transfer.

When the heat transfer system 300 of the third embodiment is in operation, the local core 310 is positioned adjacent the electronic component 10 to be cooled. Heat dissipates through the local core 310, through the local thermoelectric modules 320A, 320B, 320C, 320D, and through the local heat sinks 330A, 330B, 330C, 30D. The liquid conduits 360H, 360C, carry a cooling fluid that further dissipates the heat by circulating the fluid away from and into the remote core 390. The liquid conduits 360H, 360C may be thermally insulated (not shown). As shown, the liquid conduits may include one or more conduits 360H for carrying relatively hot water away from the local heat sinks, and one or more conduits 360C for carrying relatively cool water back to the local heat sinks.

In the third embodiment, a pump 365 may be positioned and configured to cause the cooling fluid to flow through a substantially closed circuit, as shown in FIG. 5. The cooling fluid may pass through a radiator 375 where additional heat is dissipated before the fluid enters the remote core 390. There, heat is further dissipated through the remote core 390 itself, through the remote thermoelectric modules 380A, 380B, 380C, 380D, and then through the remote heat sinks 370A, 370B, 370C, 370D.

Fourth Embodiment

Figure 6:
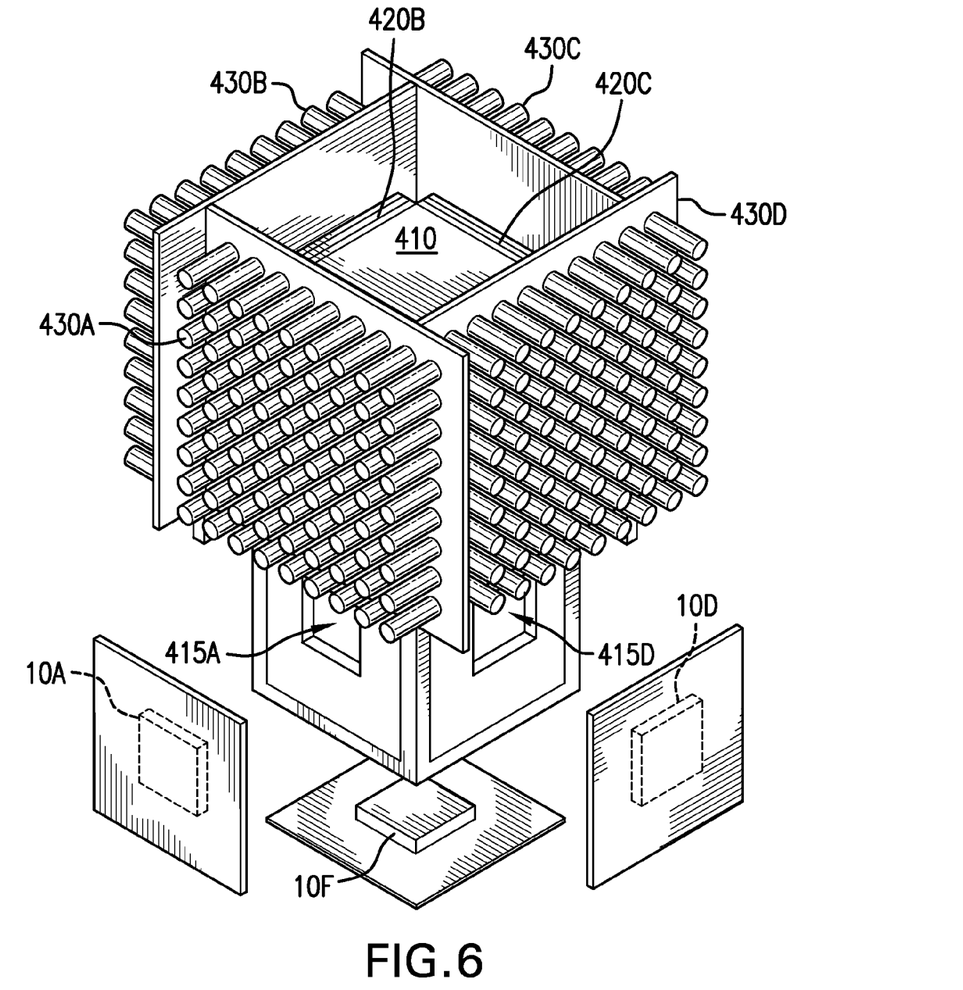
FIG. 6 is a perspective, partially exploded illustration of a heat transfer system according to a fourth embodiment.

FIG. 6 is a perspective, partially exploded illustration of a heat transfer system 400 according to a fourth embodiment. As shown, the heat transfer system 400 may include one or more electronic components 10A, 10D, 10F to be cooled, an elongated core 410, a plurality of thermoelectric modules 420A (not seen), 420B, 420C, 420D (not seen), and a plurality of heat sinks 430A, 430B, 430C, 430D. The system 400 may also include a plurality of thermocouples 425 (not shown) for sensing temperatures in an around the core 410. The heat transfer system 400 may also include an air mover (not shown) to help increase the effectiveness of the heat sinks. The heat transfer system 400 may also include a duct (not shown) positioned to direct at least a portion of the flow of air toward a desired location.

The elongated core 410 of the heat transfer system 400 may be positioned atop an electronic component 10F, as shown, so that the core 410 is in thermal communication with the electronic component 10F. In this embodiment, the elongated core 410 may be elongate in shape such that one or more additional electronic components 10A, 10D may be positioned adjacent to and in thermal communication with the core 410. For an elongated core 410 shaped like a cube or a rectangular prism, six outer surfaces are available, upon which any number of electronic components may be placed. The electronic components to be cooled/heated may or may not be connected electrically to one another. Any external surfaces of the elongated core 410 that are not in contact with a thermoelectric module, a heat sink, or another device may be thermally insulated (not shown). In operation, the system 400 may cool the electronic components 10A, 10D, 10F to sub-ambient temperatures and/or heat the components to high temperatures above the boiling point of water.

The elongated core 410 has a base, a generally opposing top surface, and at least one side surface. In one aspect, the base of the elongated core 410 defines a base cavity (not shown) that is sized and shaped to receive an electronic component 10F. Also, as shown in FIG. 6, a side surface of the elongated core 410 may define a first side cavity 415A that is sized and shaped to receive an electronic component 10A. Similarly, another side surface of the elongated core 410 may define a fourth side cavity 415D that is sized and shaped to receive an electronic component 10D. The cavities in the elongated core 410 may BE sized and shaped to a close tolerance relative to the size and shape of the corresponding electronic component to be cooled on that particular side surface. In this aspect, the electronic components 10A, 10D may be in direct physical contact with the walls of the cavities 415A, 415D. In alternate embodiments, the cavity may be oriented to hold a liquid bath, and sized and shaped to receive an electronic component into the cavity, such that the electronic component is surrounded by a fluid.

When the heat transfer system 400 of the fourth embodiment is in operation, the elongated core 410 is positioned adjacent the electronic components to be cooled. Heat dissipates through the elongate core 410, through the thermoelectric modules 420A (not seen), 420B, 420C, 420D (not seen), and through the heat sinks 430A, 430B, 430C, 430D.

Testing Method

An electronic component may be tested in an air flow chamber, such as the air flow bench illustrated in FIG. 7. As described above, T-type thermocouples may be embedded into or otherwise placed near the heat sinks, and also may be placed adjacent to the electronic component to sense the temperatures. The airflow data and temperature data may be recorded using a data acquisition system.

In one aspect, a method of testing may include a first step in which the electronic component (processor) is biased, to ensure it is in proper working condition. The power source may then be disconnected and the heat transfer system, including the thermoelectric heating/cooling modules described above, may be powered on. The control circuit, described above and illustrated in FIG. 8, may be used to selective heat and then cool the electronic component.

In one embodiment, the electronic component may be cycled between −40° C. (−40° F.) and 120° C. (248° F.). The electronic component may be cooled back to ambient or room temperature, 22.7° C. (72.9° F.), between each thermal cycling test. Each thermal cycle may include a heating phase from room temperature to 120° C., a dwell phase of twenty minutes, and then a cooling phase from 120° C. down to −40° C. For the heating phase, the control circuit 500 described herein and illustrated schematically in FIG. 8 may be used to place the thermoelectric modules into heating mode. The cooling phase may include the use of ambient air and, in addition, may use the thermoelectric modules (in cooling mode) to further cool the electronic component to sub-ambient temperatures (down to −40° C.). The thermal cycle may be repeated any number of times in order to adequately test the electronic component under the stress of changing environmental conditions.

After the thermal cycling is completed, the heat transfer system and the electronic component may be once again cooled to room temperature, and the electronic component may be biased again in order to check for discontinuities, defects, or other failures.

CONCLUSION

Although the heat transfer systems are described herein in the context of cooling a small electronic component such as a microchip or microprocessor, the technology disclosed herein is also useful and applicable in other contexts. Moreover, although several embodiments have been described herein, those of ordinary skill in art, with the benefit of the teachings of this disclosure, will understand and comprehend many other embodiments and modifications for this technology. The invention therefore is not limited to the specific embodiments disclosed or discussed herein, and that may other embodiments and modifications are intended to be included within the scope of the appended claims. Moreover, although specific terms are occasionally used herein, as well as in the claims or concepts that follow, such terms are used in a generic and descriptive sense only, and should not be construed as limiting the described invention or the claims that follow.

The invention claimed is:

1. A system for testing an electronic component, comprising:
   a core in thermal communication with an electronic component, said core comprising a base, a generally opposing top, and at least one side surface, wherein said core defines a cavity that is sized and shaped to receive said electronic component;
   a plurality of solid state heating/cooling devices each in thermal communication with said core and connected to a power supply;
   a plurality of heat sinks each in thermal communication with at least one of said plurality of solid state heating/cooling devices; and
   an air flow bench comprising an air mover, a test chamber, a control system, and a plurality of sensors, wherein said core and said electronic component are positioned within said test chamber.

2. The system of claim 1, wherein said cavity is sized and shaped to contain a liquid bath and to receive said electronic component into said liquid bath.

3. The system of claim 1, wherein said plurality of sensors comprises a thermocouple positioned adjacent one or more of said plurality of solid state heating/cooling devices.

4. The system of claim 1, wherein one or more of said plurality of solid state heating/cooling devices comprises a thermoelectric module.

5. The system of claim 1, further comprising an air mover positioned to produce a flow of air adjacent one or more of said plurality of heat sinks.

6. The system of claim 1, wherein said core, said plurality of solid state heating/cooling devices, said plurality of heat sinks, and said air flow bench cooperate to cool said electronic component to a sub-ambient temperature.

7. The system of claim 1, further comprising:
a secondary core spaced apart from said core in a substantially vertical stack;
a plurality of secondary solid state heating/cooling devices each in thermal communication with said secondary core;
a plurality of secondary heat sinks each in thermal communication with one of said plurality of secondary solid state heating/cooling devices; and
one or more liquid conduits for facilitating the flow of a cooling fluid through a substantially closed circuit that extends between said secondary core and one or more of said heat sinks.

8. The system of claim 1, further comprising:
a remote core spaced apart from said core;
a plurality of remote solid state heating/cooling devices each in thermal communication with said remote core;
a plurality of remote heat sinks each in thermal communication with one of said plurality of remote solid state heating/cooling devices;
one or more liquid conduits for facilitating the flow of a cooling fluid through a substantially closed circuit that extends from between said remote core and one or more of said heat sinks; and
a pump that is positioned and configured to cause said cooling fluid to flow through said substantially closed circuit,
wherein one of said plurality of remote heat sinks comprises a radiator that is positioned between said remote core and one or more of said heat sinks.

9. The system of claim 1, wherein said electronic component comprises a plurality of electronic components, each in thermal communication with said core,
and wherein one or more of said base, said top, and said at least one side surface of said core defines a plurality of cavities, each sized and shaped to receive one of said plurality of electronic components.

10. A system for cooling an electronic component, comprising:
a primary core in thermal communication with an electronic component, said primary core comprising a base, a generally opposing top, and at least one side surface, wherein said at least one side surface of said primary core defines at least one cavity that is sized and shaped to receive said electronic component;
a plurality of primary solid state heating/cooling devices each in thermal communication with said primary core and connected to a primary power supply;
a plurality of primary heat sinks each in thermal communication with one of said plurality of primary solid state heating/cooling devices;
a secondary core spaced apart from said primary core;
a plurality of secondary solid state heating/cooling devices each in thermal communication with said secondary core and connected to a secondary power supply;
a plurality of secondary heat sinks each in thermal communication with one of said plurality of secondary solid state heating/cooling devices; and
one or more liquid conduits for facilitating the flow of a cooling fluid through a substantially closed circuit that extends between said secondary core and one or more of said primary heat sinks; and
an air flow bench comprising an air mover, a test chamber, a control system, and a plurality of sensors, wherein said core and said electronic component are positioned within said test chamber.

11. The system of claim 10, wherein said electronic component comprises one or more electronic components,
and wherein one or more of said base and said top, defines a plurality of cavities, each sized and shaped to receive one of said one or more electronic components, such that each is in thermal communication with said primary core.

12. The system of claim 10, wherein one or more of said base and said top defines a plurality of cavities, each sized and shaped to contain a liquid bath and to receive said electronic component into said liquid bath, such that said electronic component is in thermal communication with said primary core.

13. The system of claim 10, further comprising:
an air mover positioned to produce a flow of air adjacent one or more of said plurality of primary and secondary heat sinks; and
a duct positioned to direct at least a portion of said flow of air adjacent one or more of said plurality of primary and secondary heat sinks.

14. A method of thermal-cycle testing an electronic component, comprising:
providing a core that defines a cavity sized and shaped to receive an electronic component;
placing an electronic component into said cavity, such that said electronic component is in thermal communication with said core;
at least partially surrounding said core with one or more solid state heating/cooling devices, each in thermal communication with said core and connected to a power supply;
at least partially surrounding said one or more solid state heating/cooling devices with a plurality of heat sinks, each in thermal communication with one of said plurality of solid state heating/cooling devices;
selectively supplying power to said electronic component to confirm its status;
heating said electronic component in an unpowered state to a predetermined maximum temperature by selectively placing said one or more solid state heating/cooling devices into a heating mode;
cooling said electronic component to a predetermined minimum temperature by selectively placing said one or more solid state heating/cooling devices into a cooling mode; and
selectively supplying power to said electronic component to confirm its status.

15. The method of claim 14, wherein said steps of heating and cooling further comprise the step of providing a control circuit that is configured to induce said heating mode, and selectively reverse the current in order to induce said cooling mode.

16. The method of claim 14, further comprises the step of:
providing an air flow bench, comprising an air mover, a test chamber, a control system, and a plurality of sensors;
positioning said core, said electronic component, said one or more solid state heating/cooling devices, and said plurality of heat sinks within said test chamber;
measuring and recording at least a temperature, an air flow rate, and a power input during execution of said method.

\* \* \* \* \*